(12) United States Patent
Yuan et al.

(10) Patent No.: US 10,998,720 B2
(45) Date of Patent: May 4, 2021

(54) T-COIL ENHANCED ESD PROTECTION WITH PASSIVE EQUALIZATION

(71) Applicant: QUALCOMM Incorporated, San Diego, CA (US)

(72) Inventors: Xiaobin Yuan, Cary, NC (US); Carrie Ellen Cox, Apex, NC (US); Joseph Natonio, Pleasant Valley, NY (US); Siqi Fan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 722 days.

(21) Appl. No.: 15/788,650

(22) Filed: Oct. 19, 2017

(65) Prior Publication Data

US 2019/0123551 A1  Apr. 25, 2019

(51) Int. Cl.
| | |
|---|---|
| *H02H 9/04* | (2006.01) |
| *H03G 3/30* | (2006.01) |
| *H04B 1/16* | (2006.01) |
| *H04L 25/03* | (2006.01) |
| *H01L 27/02* | (2006.01) |

(52) U.S. Cl.
CPC ......... *H02H 9/045* (2013.01); *H01L 27/0255* (2013.01); *H01L 27/0288* (2013.01); *H02H 9/046* (2013.01); *H03G 3/30* (2013.01); *H04B 1/16* (2013.01); *H04L 25/03* (2013.01); *H04L 25/03031* (2013.01); *H04L 25/03057* (2013.01)

(58) Field of Classification Search
CPC . H01L 27/0255; H01L 27/0288; H02H 9/045; H02H 9/046; H03F 1/52; H03F 3/195; H03G 3/30; H04B 1/16; H04B 3/14; H04B 3/141; H04B 3/142; H04B 3/143; H04B 3/144; H04B 3/145; H04B 3/146; H04B 3/147; H04B 3/148; H04L 25/03; H04L 25/03031; H04L 25/03057
See application file for complete search history.

(56) References Cited

U.S. PATENT DOCUMENTS

| | | | |
|---|---|---|---|
| 6,433,985 | B1 | 8/2002 | Voldman et al. |
| 8,319,579 | B2 | 11/2012 | Zhuang et al. |
| 8,559,145 | B1 | 10/2013 | Kireev et al. |

(Continued)

FOREIGN PATENT DOCUMENTS

EP        1538671 A2     6/2005

OTHER PUBLICATIONS

International Search Report and Written Opinion—PCT/US2018/051846—ISA/EPO—dated Dec. 6, 2018.

*Primary Examiner* — Jared Fureman
*Assistant Examiner* — Nicolas Bellido
(74) *Attorney, Agent, or Firm* — Chui-kiu T. Wong

(57) ABSTRACT

An Electro-Static Discharge (ESD) protection circuit is disclosed. In some implementations, the ESD protection circuit includes a first ESD diode, a second ESD diode, a passive equalization network and a programmable resistor network. The first ESD diode is coupled to the passive equalization network. The programmable resistor network is coupled between the passive equalization network and the second ESD diode. The programmable resistor network can be programmed to place the ESD protection circuit in one of a plurality of receiver modes based on a type of a transmitter from which the receiver is receiving signals.

12 Claims, 7 Drawing Sheets

(56) References Cited

U.S. PATENT DOCUMENTS

| | | | |
|---|---|---|---|
| 8,947,840 B1 | 2/2015 | Milirud et al. | |
| 9,391,451 B1 | 7/2016 | Ransijn | |
| 9,432,230 B1* | 8/2016 | Chang | H04B 3/14 |
| 10,498,564 B2* | 12/2019 | Jalali Far | H04L 25/0272 |
| 2004/0120092 A1 | 6/2004 | Jaussi et al. | |
| 2006/0151851 A1 | 7/2006 | Pillai et al. | |
| 2007/0030092 A1* | 2/2007 | Yeung | H04B 3/145 |
| | | | 333/28 R |
| 2008/0238588 A1* | 10/2008 | Yeung | H04B 3/145 |
| | | | 333/28 R |
| 2013/0064326 A1 | 3/2013 | Chen et al. | |

* cited by examiner

T-COIL ENHANCED ESD PROTECTION WITH PASSIVE EQUALIZATION

FIELD OF DISCLOSURE

Aspects of the present disclosure relate generally to electrostatic discharge (ESD) protection scheme, and more particularly to T-coil enhanced ESD protection with passive equalization.

BACKGROUND

Electrostatic discharge (ESD) is a common problem in semiconductor applications. Electrical shorts or dielectric breakdown caused by ESD can lead to damages of semiconductor chips. To protect semiconductor chips from damages caused by ESD, some form of ESD protection scheme is typically included in a semiconductor chip. In a semiconductor chip having a signal receiver (e.g., Serializer/Deserializer (SerDes) receiver), a conventional ESD protection scheme comprising a set of primary diodes and a set of secondary diodes is usually included in an analog front end (AFE) of the receiver, such as the one illustrated in FIG. 1. The semiconductor device 100 shown in FIG. 1 includes an input/output (I/O) pad 101, primary diodes 110, secondary diodes 120, a charge device model (CDM) resistor 130, and receiver circuits 150.

The primary diodes 110 can handle a slower human body model (HBM) transient while the secondary diodes 120 can handle CDM transient. In cases where the CDM transient is faster and/or larger, the CDM resistor 130 can be added in between the primary diodes 110 and the secondary diodes 120 to provide impedance division to lower the voltage at transistor gate. However, addition of the CDM resistor 130 can lead to signal loss. Such signal loss is particularly problematic in high speed receivers. Therefore, a more efficient ESD protection scheme for high speed receiver is desired.

SUMMARY OF THE DISCLOSURE

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

Some implementations of the disclosure relate to an ESD protection circuit in a receiver. In some implementations, the ESD protection circuit includes a first diode, a second diode, a passive equalization network, and a programmable resistor network. The programmable resistor network is coupled between the passive equalization network and the second ESD diode, wherein the passive equalization network is coupled between the first ESD diode and the programmable resistor network.

In some implementations, the ESD protection circuit further includes a T-coil network coupled between the first ESD diode and a pad through which signals are received.

In some implementations, the passive equalization network includes a capacitor having a first terminal and a second terminal, the first terminal coupled to the first ESD diode, and the second terminal coupled to the programmable resistor network. In addition, the passive equalization network includes a resistor coupled in parallel to the capacitor.

In some implementations, the programmable resistor network is configured to level shift a common mode voltage of signals from the first ESD diode. The programmable resistor may include a first resistor, a second resistor, a third resistor, and a fourth resistor coupled together at a node X, wherein the passive equalization network is coupled to the node X; a first n-type transistor and a second n-type transistor, wherein the first n-type transistor and the first resistor are coupled in series between the node X and a power supply, and the second n-type transistor and the second resistor are coupled in series between the node X and the power supply; and a first p-type transistor and a second p-type transistor, wherein the first p-type transistor and the third resistor are coupled in series between the node X and ground, and the second p-type transistor and the fourth resistor are coupled in series between the node X and ground.

In some implementations, the programmable resistor network is programmable to place the receiver in one of a plurality of receiver modes based on a type of a transmitter from which the receiver is receiving signals. In some implementations, the programmable resistor network is configured to be programmed by turning on or turning off the first and second n-type transistors and the first and second p-type transistors.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

Figure 1:
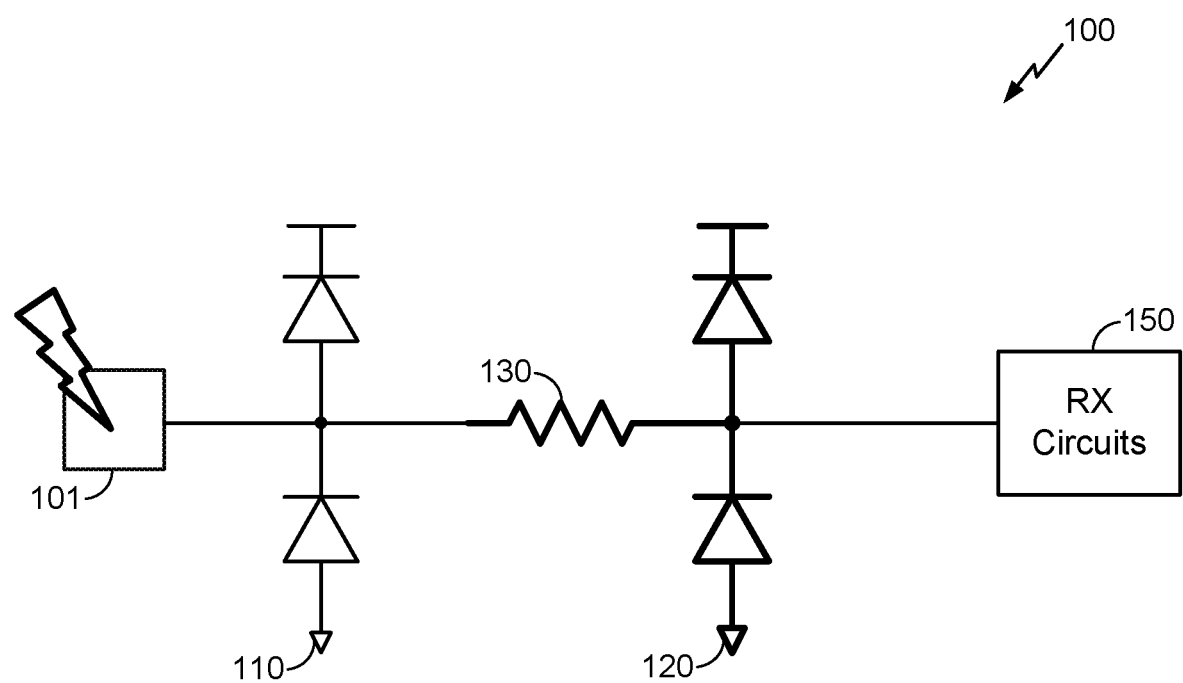
FIG. 1 illustrates a semiconductor device with a conventional ESD protection scheme.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements may be physical, logical, or a combination thereof. As used herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not limit the quantity or order of the element. Rather, the designations are used herein as a convenient method of distinguishing between two or more elements or instances of an element. Thus, a reference to first and second elements does not mean that only two elements can be employed, or that the first element must precede the second element. As used herein, references to the plural include the singular, and references to the singular include the plural.

To receive signals from external sources, a semiconductor device typically includes a receiver. A receiver data path is provided within the semiconductor device to route signals to the receiver. The receiver data path includes input/output (I/O) pads, various equalization circuits, and receiver circuits. To protect the semiconductor device from electro-static discharge (ESD), an ESD protection scheme is coupled between the I/O pads and the receiver circuits. As discussed above, the charge device model (CDM) resistor causes signal loss in the receiver data path. To provide electro-static discharge (ESD) protection while limiting signal loss, a passive equalization network is coupled between a primary ESD diode and a secondary ESD diode to replace the charge device model (CDM) resistor in some implementations. In general, the passive equalization network in a receiver data path can provide peaking and programmable common mode voltage adjustments. In some implementations, a programmable resistor network is further coupled between the passive equalization network and the secondary ESD diode. In addition to level shifting incoming signals to an appropriate common mode level for the receiver circuits, the programmable resistor network can be programmed to set the receiver in one of a set of modes. More details are discussed below with reference to the examples shown in the figures.

Figure 2:
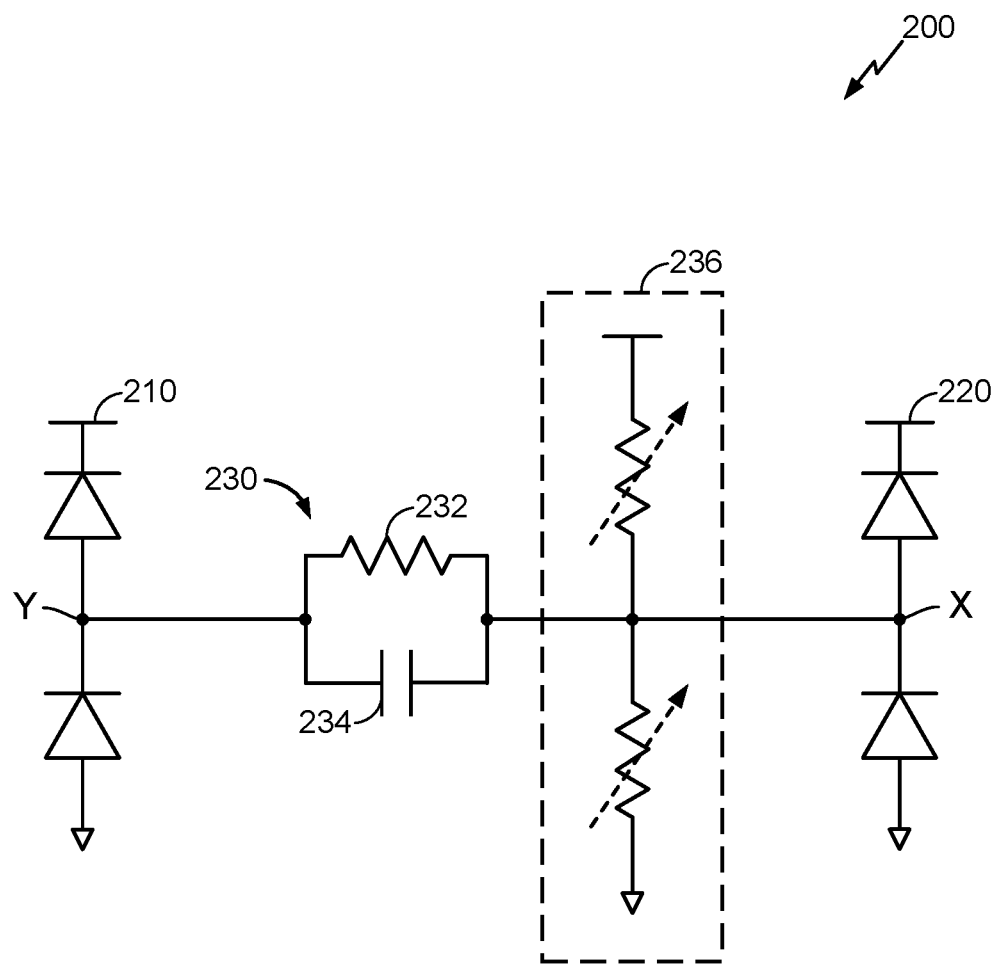
FIG. 2 illustrates one implementation of an ESD protection circuit.

FIG. 2 illustrates one implementation of an ESD protection circuit. The ESD protection circuit 200 includes a set of primary ESD diodes 210, a set of secondary ESD diodes 220, and a passive equalization network 230 coupled between the ESD diodes 210 and 220. The passive equalization network 230 includes a resistor 232 and a capacitor 234 coupled in parallel to each other. In addition to the passive equalization network 230, the ESD protection circuit 200 includes a programmable resistor network 236. As illustrated in FIG. 2, the primary ESD diodes 210 and the passive equalization network 230 are coupled to each other at node Y. The passive equalization network 230 is further coupled to the secondary ESD diodes 220 and the programmable resistor network 236 at node X. The ESD protection circuit 200 can be further coupled to receiver circuits (not shown) at node X.

During operation, signals received via I/O pads (not shown) are routed to the primary ESD diodes 210 in the ESD protection circuit 200. The primary ESD diodes 210 typically can handle a slower human body model (HBM) transient current. For faster and/or larger charge device model (CDM) transient current, the secondary ESD diodes 220, the passive equalization network 230, and the programmable resistor network 236 together provide impedance division to lower the voltage at the transient gate. In addition, the programmable resistor network 236 level shifts the incoming signals to a predetermined common mode voltage required by the receiver circuits (not shown). The programmable resistor network 236 can be programmed or configured in a number of predefined ways to put the receiver in one of a set of modes. Some examples of the modes are further discussed below.

By replacing the CDM resistor with the passive equalization network 230 and the programmable resistor network 236 in the ESD protection circuit 200, similar level of ESD protection (in comparison with the conventional ESD protection scheme shown in FIG. 1) can be achieved without suffering the signal loss caused by the CDM resistor. As a result, the ESD protection circuit 200 can provide better gain and bandwidth.

Figure 3:
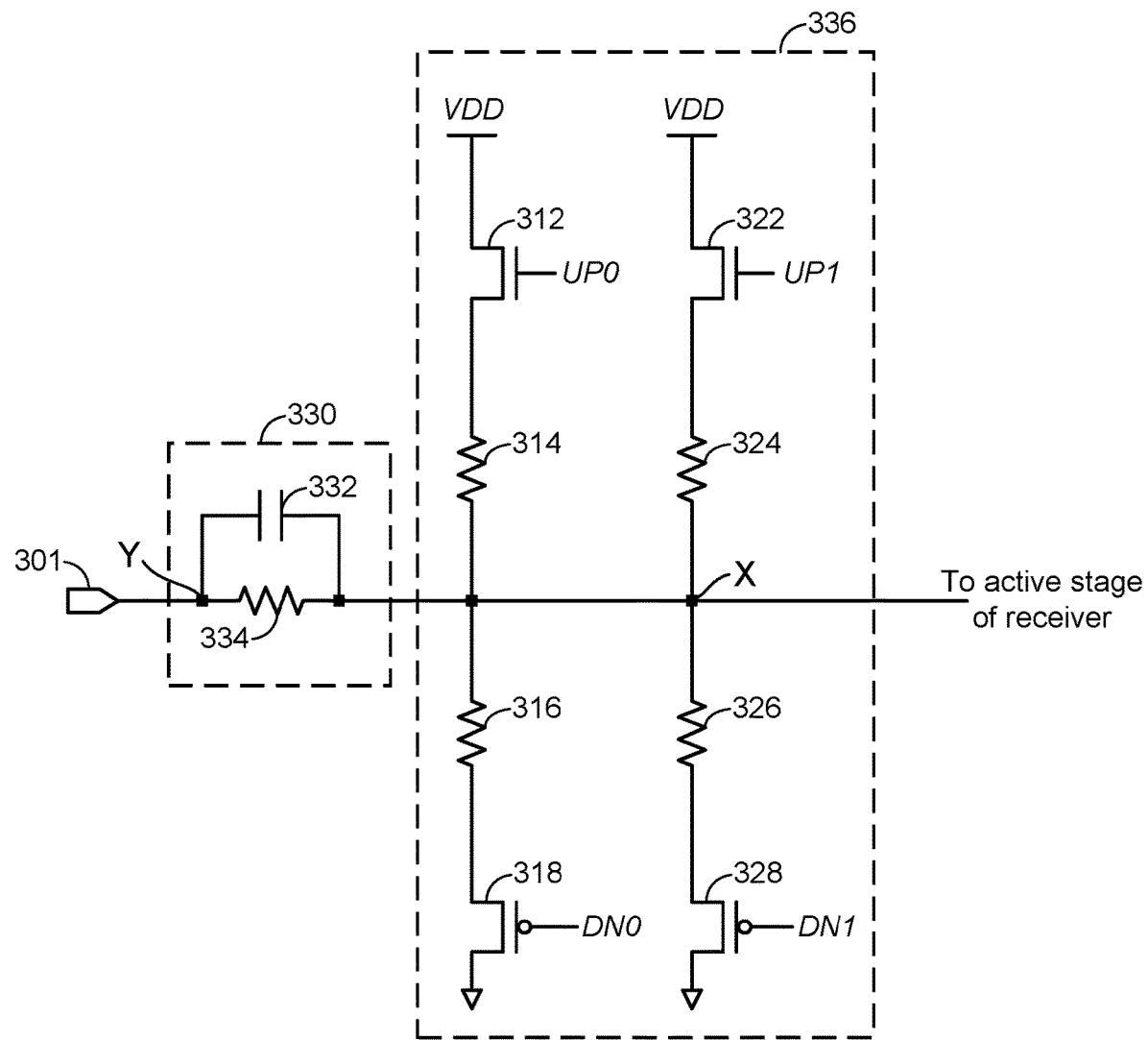
FIG. 3 illustrates one implementation of a passive equalization network and a programmable resistor network usable in the ESD protection circuit 200 in FIG. 2.

FIG. 3 illustrates one implementation of a passive equalization network and a programmable resistor network usable in the ESD protection circuit 200 in FIG. 2. Like the passive equalization network 230 shown in FIG. 2, the passive equalization network 330 in FIG. 3 includes a capacitor 332 and a resistor 334 coupled to each other in parallel between node X and node Y. Node Y can be further coupled to I/O pads 301. As illustrated in FIG. 3, node X is coupled to a programmable resistor network 336.

In some implementations, the programmable resistor network 336 includes four resistors 314, 316, 324, and 326 coupled to each other at node X. The programmable resistor network 336 further includes a first n-type transistor UP0 312 and a second n-type transistor UP1 322 coupled to resistors 314 and 324, respectively, at the respective drain of the n-type transistors UP0 312 and UP1 322. The source of both n-type transistors UP0 312 and UP1 322 are coupled to a power supply rail Vdd. In addition, the programmable resistor network 336 includes a first p-type transistor DN0 318 and a second p-type transistor DN1 328 coupled to resistors 316 and 326, respectively, at the respective drain of the p-type transistors DN0 318 and DN1 328. The source of both p-type transistors DN0 318 and DN1 328 are coupled to ground.

In operation, the n-type transistors UP0 312 and UP1 322 and the p-type transistors DN0 318 and DN1 328 can be switched on or off in different ways or in different combinations to set the receiver in a particular mode of operation. For example, Table 1 below shows an exemplary set of modes of operation used in some implementations.

TABLE 1

Exemplary receiver mode configurations

| | Mode | | | |
|---|---|---|---|---|
| | UP0 | UP1 | DN0 | DN1 |
| SST 0.8-1.0 V | 1 | 0 | 0 | 0 |
| SST 1.2 V | 0 | 0 | 1 | 0 |
| AC Couple | 0 | 1 | 1 | 0 |
| CML 1.2 V | 0 | 0 | 0 | 1 |

In the above example, "SST 0.8-1.0V" is a receiver mode that works with SST (source series terminated) transmitters operating in the supply voltage range of 0.8-1.0V. "SST 1.2V" is a receiver mode that works with SST (source series terminated) transmitters operating at 1.2V supply. "AC Couple" is a receiver mode in which the receiver applies AC coupling at the I/O pad. "CML 1.2V" is a receiver mode that works with CML (current mode logic) transmitter under a 1.2V supply. One of skill in the art should readily recognize that the above are merely some of the exemplary modes that the programmable resistor network 336 can be used to program the receiver in. In other implementations, the programmable resistor network 336 can be configured in different ways to set the receiver in other modes not shown above.

Figure 4:
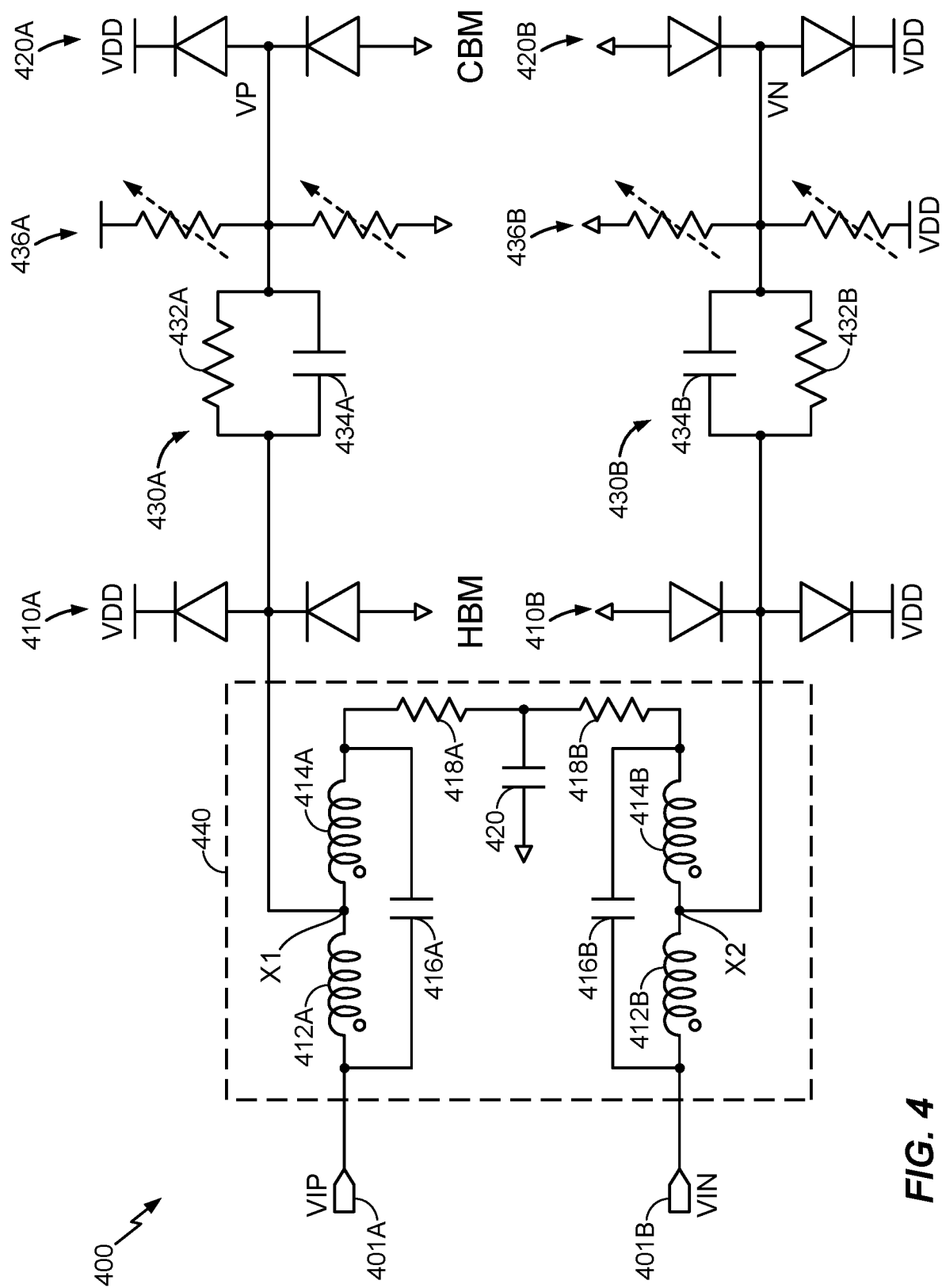
FIG. 4 illustrates one implementation of a T-coil enhanced ESD protection scheme.

FIG. 4 illustrates one implementation of a T-coil enhanced ESD protection circuit. Similar to the ESD protection circuit 200 shown in FIG. 2, the T-coil enhanced ESD protection circuit 400 includes a set of primary ESD diodes 410A and 410B, a set of secondary ESD diodes 420A and 420B, a first passive equalization network 430A coupled between the ESD diodes 410A and 420A, and a second passive equalization network 430B coupled between the ESD diodes 410B and 420B. The primary ESD diodes 410A and 410B are coupled to I/O pads 401A and 401B, respectively, to receive input signals. The passive equalization network 430A includes a resistor 432A and a capacitor 434A coupled in parallel to each other. Likewise, the passive equalization network 430B includes a resistor 432B and a capacitor 434B coupled in parallel to each other. In addition, the T-coil enhanced ESD protection circuit 400 includes a T-coil network 440 coupled between I/O pads 401A and 401B and the set of primary ESD diodes 410A and 410B.

In some implementations, the T-coil network 440 includes two inductors 412A and 414A connected to each other in series. Inductor 412A is connected between I/O pad 401A and node X1. Node X1 is further connected to primary ESD diode 410A. The I/O pad 401A is also connected to a first terminal of a capacitor 416A. Inductor 414A is connected between node X1 and a second terminal of capacitor 416A. Thus, the capacitor 416A is connected in parallel to the inductors 412A and 414A. The second terminal of capacitor 416A is also connected to a first terminal of a resistor 418A. The second terminal of resistor 418A is connected to a first terminal of a capacitor 420. The second terminal of capacitor 420 is connected to ground.

The T-coil network 440 includes two more inductors 412B and 414B connected to each other in series. Inductor 412B is connected between I/O pad 401B and node X2. Node X2 is further connected to primary ESD diode 410B. The I/O pad 401B is also connected to a first terminal of a capacitor 416B. Inductor 414B is connected between node X2 and a second terminal of capacitor 416B. Thus, the capacitor 416B is connected in parallel to the inductors 412B and 414B. The second terminal of capacitor 416B is also connected to a first terminal of a resistor 418B. The second terminal of resistor 418B is connected to a first terminal of capacitor 420.

T-coil network 440 is used to reduce reflection and extend bandwidth of the signal path. In some implementations, analytical expressions have been used to design the parameters of T-coil network 440 for optimum reflection, group delay, and bandwidth when a complex impedance load (representing the total impedance of the ESD circuit 400 and ensuing transistor input gate) is presented between the upper and lower coils. The analytical expressions are derived from a small-signal equivalent circuit of T-coil network 440, primary ESD diodes 410A, 410B, secondary ESD diodes 420A, 420B, and passive equalization network 430A, 430B.

Figure 5:
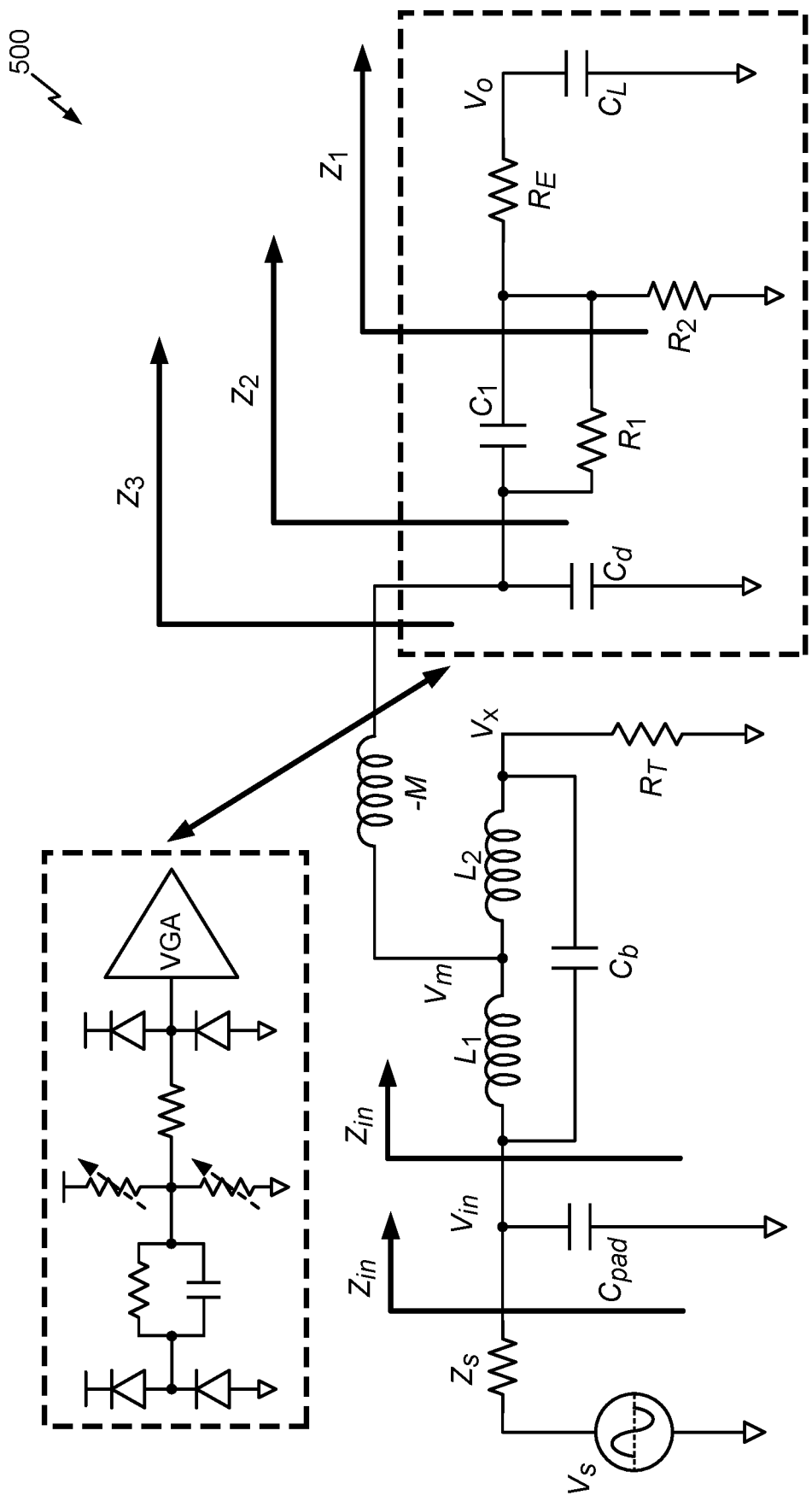
FIG. 5 illustrates one example of the small-signal equivalent circuit 500 of T-coil network 440, primary ESD diodes 410A, 410B, secondary ESD diodes 420A, 420B, and passive equalization network 430A, 430B shown in FIG. 4.

FIG. 5 illustrates one example of the small-signal equivalent circuit 500 of T-coil network 440, primary ESD diodes 410A, 410B, secondary ESD diodes 420A, 420B, and passive equalization network 430A, 430B in FIG. 4. $V_s$ and $Z_s$ are the source voltage and output impedance, respectively, used in the analysis. $C_{pad}$ represents the pad capacitance seen at the I/O pads 401A and 401B. $L_1$ and $L_2$ are the total inductances of the upper coils and lower coils of T-coil network 440 (i.e., coils 412A, 414A, 412B, and 414B in FIG. 4). M and $C_b$ are the mutual inductance and bridging capacitance of the coils. Cd represents the capacitance of the primary ESD diodes 410A and 410B, and $C_L$ represents the total capacitance of the secondary ESD diodes 420A and 420B, and an input transistor of the active stage of the receiver. $R_1$, $R_2$, and $C_1$ represent the elements in the passive equalization networks 430A and 430B. $R_E$ is the small ESD resistor implemented using metal wire.

Applying Kirchhoff's Current Law (KCL) on nodes $V_x$, $V_m$, and $V_{in}$, the following expressions are obtained:

$$(Vin - Vx) * S * Cb = \frac{Vx}{R_T} - \frac{Vm - Vx}{S * L_Z} \quad (1)$$

$$\frac{Vin - Vm}{S * L1} = \frac{Vm - Vx}{S * L2} + \frac{Vm}{Z - S * M} \quad (2)$$

$$\frac{Vin - Vm}{S * L1} + S * Cb * (Vin - Vx) = Iin \quad (3)$$

where $I_{in}$ is the total current flowing into the T-coil. From Expressions (1) and (2), the following can be obtained:

$$V_{in} * S^2 \cdot R_T * C_b + V_m * R_T = V_x * (S^2 * L_2 * R_T \cdot C_b + S * L_2 + R_T) \quad (4)$$

$$-L_2 * (Z_3 - S*M) * V_{in} + [(L_2 + L_1) * (Z_3 - S*M) + L_1 * L_2 * S] \\ * V_m = L_1 * (Z_3 - S*M) * V_x \quad (5)$$

Using expressions (3)–(5), the voltage transfer functions from $V_{in}$ to nodes $V_m$ and $V_x$, as well as the input impedance looking into T-coil network 440 (excluding $C_{pad}$) can be derived as follows:

$$H_{vm} = \frac{V_m}{V_{in}} = \frac{S^2 * L_1 * L_2 * R_T * C_b * c + L_2 * a * c}{a * b - R_T * L_1 * c} \quad (6)$$

$$H_{vx} = \frac{V_x}{V_{in}} = \frac{S^2 * L_2 * R_T * C_b * b + R_T * L_2 * c}{a * b - R_T * L_1 * c} \quad (7)$$

$$Z_{in} = \frac{V_{in}}{I_{in}} = S * \frac{L_1}{1 - H_{vm} + S^2 * L_1 * C_b * (1 - H_{vx})} \text{ where} \quad (8)$$

$$a = S^2 * L_2 * R_T * C_b + S * L_2 + R_T \quad (9)$$

-continued $$b = (L_1 + L_2)(Z_3 - S*M) + L_1 * L_2 * S \quad (10)$$

$$c = Z_3 - S*M \quad (11)$$

Therefore, the voltage transfer function from the source $V_s$ to the output node $V_o$ can be expressed as:

$$H_{WO\_S} = H_{Wm} * \frac{Z_{in}}{Z_{in} + Z_S} * \frac{Z_3}{Z_3 - S*M} * \frac{Z_1}{Z_2 * (1 + S*R_E*C_L)} \quad (12)$$

where $Z_{IN}$ is the total input impedance calculated from the parallel combination of $C_{pad}$ and $Z_{in}$. $Z_1$, and $Z_2$, and $Z_3$ are the impedances seen to ground at different points of the circuits. The impedances $Z_1$, $Z_2$, and $Z_3$ can be expressed as:

$$Z_1 = R_2 * \frac{1 + S*R_E*C_L}{1 + S*C_L*(R_E + R_2)},$$

$$Z_2 = Z_1 + \frac{R_1}{1 + S*C_1*R_1}, Z_3 = \frac{Z_2}{1 + 5*C_d*Z_2} \quad (13)$$

Hence, the input reflection coefficient can be calculated by:

$$\Gamma_{IN} = \frac{Z_{IN} - Z_S}{Z_{IN} + Z_S} \quad (14)$$

Key performance metrics for T-coil network 440 are the voltage transfer function and input reflection coefficient shown in Expressions (12) and (14) above, respectively. Expressions (12) and (14) can be used to optimize parameters of T-coil network 440. For example, given the available chip area, a design goal in one implementation is to maximize high-frequency signal transferred from the source (with minimum phase distortion) while minimizing reflection at the receiver input. However, optimization of the parameters of T-coil network 440 may be done based on consideration of other goals.

Figure 6:
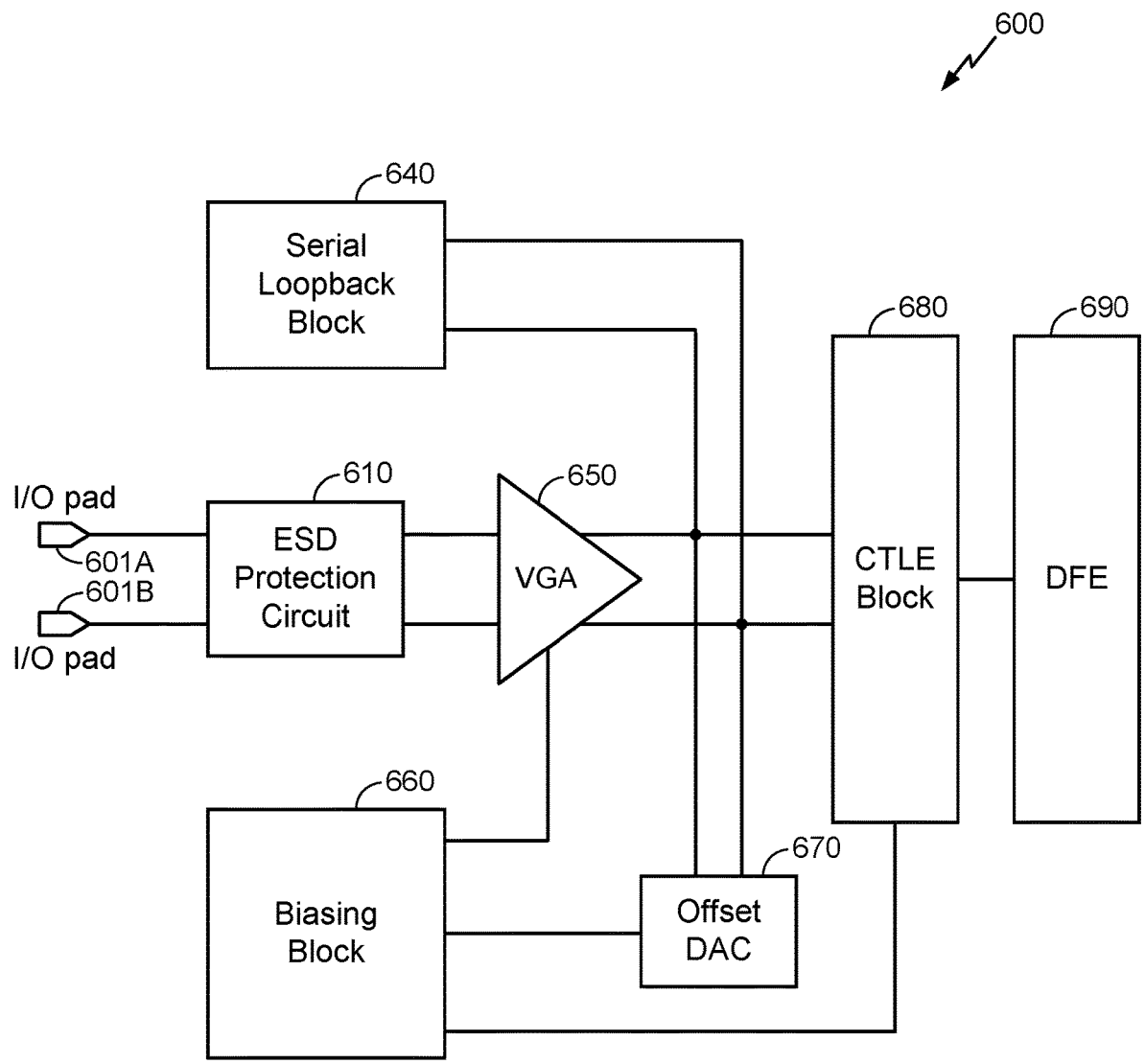
FIG. 6 illustrates one implementation of an analog front end of a receiver.

FIG. 6 illustrates one implementation of an analog front end (AFE) of a receiver. In some implementations, the receiver is a high speed SerDes receiver. The AFE 600 includes I/O pads 601A, 601B, an ESD protection circuit 610, a serial loopback block 640, a variable gain amplifier (VGA) 650, a biasing block 660, an offset digital-to-analog converter (DAC) 670, a continuous time linear equalizer (CTLE) block 680, and a decision feedback equalizer (DFE) 690. One should appreciate that the implementation of the AFE 600 shown in FIG. 6 is merely one example, other implementations of the AFE 600 may include additional components not shown in FIG. 6.

In some implementations, I/O pads 601A and 601B are coupled to ESD protection scheme 610. Signals received at I/O pads 601A and 601B are sent to ESD protection circuit 610. Some implementations of ESD protection circuit 610 have been described in detail above with reference to FIGS. 2-4. Outputs of ESD protection circuit 610 is further coupled to inputs of VGA 650. VGA 650 also receives biasing signals from biasing block 660. In addition to VGA 650, biasing block 660 provides biasing signals to Offset DAC 670 and CTLE 680. VGA 650 amplifies the signals received from ESD protection scheme 610. Offset DAC 670 provides global offset correction at the outputs of VGA 650. Likewise, serial loopback block 640 can provide loopback at the outputs of VGA 650. Outputs of VGA 650 are coupled to CTLE block 680.

In some implementations, CTLE block 680 includes two (2) CTLEs and a replica CTLE, which are all driven by outputs of VGA 650. The amount of capacitive loading from various signaling and diagnostic paths can be split between the two CTLEs, whereas the CTLE replica is used to provide common-mode voltage information during offset calibration for the downstream DFE 690. CTLE block 680 performs linear equalization on the amplified signals from VGA 650, and then sends the equalized signals to DFE 690 to be further processed.

One should appreciate that the AFE 600 described above is one example to illustrate the application of the ESD protection scheme discussed herein. One skilled in the art should readily recognize that various implementations of the ESD protection circuit disclosed can be applied to other electronic devices or systems.

Figure 7:
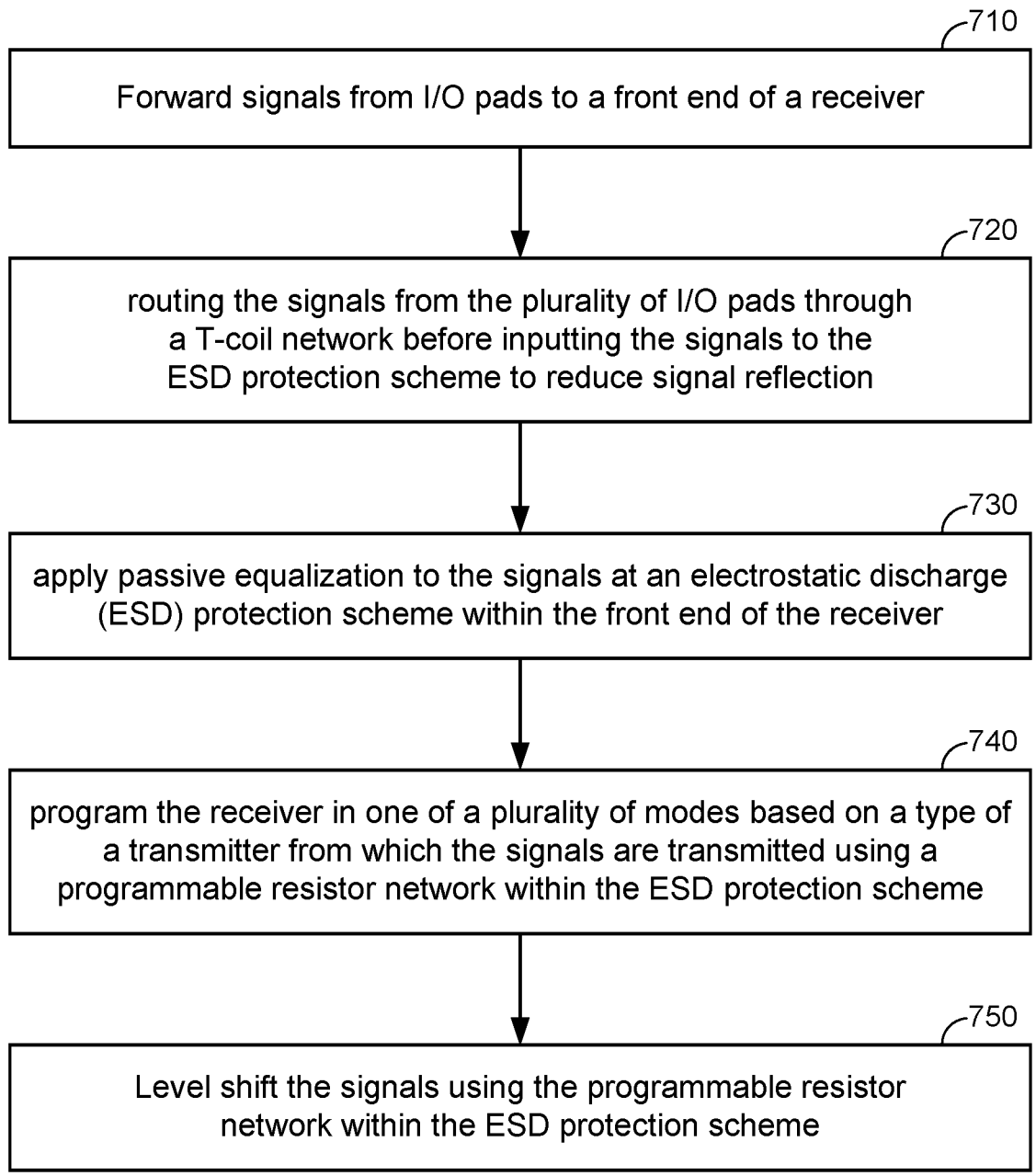
FIG. 7 illustrates one implementation of a process to provide ESD protection.

FIG. 7 illustrates one implementation of a process to provide ESD protection. The process can be implemented with circuits, such as, for example, the circuits illustrated in FIGS. 2-4. The process begins at block 710, in which signals are sent from I/O pads to a front end of a receiver. Then the process transitions to block 720, where the signals from the I/O pads are routed through a T-coil network before inputting the signals to the ESD protection scheme within the front end of the receiver to reduce signal reflection. Next, passive equalization is applied to the signals at an ESD protection scheme within the front end of the receiver in block 730. Further, the receiver is programmed in one of a plurality of modes based on a type of a transmitter from which the signals are transmitted using a programmable resistor network within the ESD protection scheme in block 740. The signals are also level-shifted using the programmable resistor network within the ESD protection scheme in block 750.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An electro-static discharge (ESD) protection circuit in a receiver, comprising:
   a first ESD diode;
   a second ESD diode;
   a passive equalization network comprising
      a capacitor having a first terminal and a second terminal, the first terminal coupled to the first ESD diode, and
      a resistor coupled in parallel to the capacitor at the first terminal and the second terminal; and
   a programmable resistor network coupled between the passive equalization network and the second ESD diode, wherein the passive equalization network is coupled between the first ESD diode and the programmable resistor network, and the second terminal of the capacitor of the passive equalization network is coupled to the programmable resistor network.

2. The ESD protection circuit of claim 1, further comprising:
a T-coil network coupled between the first ESD diode and a pad through which signals are received.

3. The ESD protection circuit of claim 1, wherein the programmable resistor network is configured to level shift a common mode voltage of signals from the first ESD diode.

4. An electro-static discharge (ESD) protection circuit in a receiver, comprising:
a first ESD diode;
a second ESD diode;
a passive equalization network; and
a programmable resistor network coupled between the passive equalization network and the second ESD diode, wherein the passive equalization network is coupled between the first ESD diode and the programmable resistor network, wherein the programmable resistor network comprises
a first resistor, a second resistor, a third resistor, and a fourth resistor coupled together at a node, wherein the passive equalization network is coupled to the node,
a first n-type transistor and a second n-type transistor, wherein the first n-type transistor and the first resistor are coupled in series between the node and a power supply, and the second n-type transistor and the second resistor are coupled in series between the node and the power supply, and
a first p-type transistor and a second p-type transistor, wherein the first p-type transistor and the third resistor are coupled in series between the node and ground, and the second p-type transistor and the fourth resistor are coupled in series between the node and ground.

5. The ESD protection circuit of claim 4, wherein the programmable resistor network is programmable to place the receiver in one of a plurality of receiver modes based on a type of a transmitter from which the receiver is receiving signals.

6. The ESD protection circuit of claim 5, wherein the programmable resistor network is configured to be programmed by turning on or turning off the first and second n-type transistors and the first and second p-type transistors.

7. A system, comprising:
a plurality of pads configured to receive signals; and
a receiver having an analog front end, the analog front end comprising
a variable gain amplifier;
an electro-static discharge (ESD) protection circuit coupled between the variable gain amplifier and the plurality of pads, the ESD protection circuit comprising
a first ESD diode;
a second ESD diode;
a passive equalization network, comprising
a capacitor having a first terminal and a second terminal, the first terminal coupled to the first ESD diode, and the second terminal coupled to the programmable resistor network, and
a resistor coupled in parallel to the capacitor at the first terminal and the second terminal; and
a programmable resistor network coupled between the passive equalization network and the second ESD diode, wherein the passive equalization network is coupled between the first ESD diode and the programmable resistor network.

8. The system of claim 7, wherein the ESD protection circuit further comprises:
a T-coil network coupled between the first ESD diode and the plurality of pads.

9. The system of claim 7, wherein the programmable resistor network is configured to level shift a common mode voltage of signals from the first ESD diode.

10. A system, comprising:
a plurality of pads configured to receive signals; and
a receiver having an analog front end, the analog front end comprising
a variable gain amplifier;
the electro-static discharge (ESD) protection circuit coupled between the variable gain amplifier and the plurality of pads, the ESD protection circuit comprising
a first ESD diode;
a second ESD diode;
a passive equalization network; and
a programmable resistor network coupled between the passive equalization network and the second ESD diode, wherein the passive equalization network is coupled between the first ESD diode and the programmable resistor network, wherein the programmable resistor network comprises:
a first resistor, a second resistor, a third resistor, and a fourth resistor coupled together at a node, wherein the passive equalization network is coupled to the node,
a first n-type transistor and a second n-type transistor, wherein the first n-type transistor and the first resistor are coupled in series between the node and a power supply, and the second n-type transistor and the second resistor are coupled in series between the node and the power supply, and
a first p-type transistor and a second p-type transistor, wherein the first p-type transistor and the third resistor are coupled in series between the node and ground, and the second p-type transistor and the fourth resistor are coupled in series between the node and ground.

11. The system of claim 10, wherein the programmable resistor network is programmable to place the receiver in one of a plurality of receiver modes based on a type of a transmitter from which the receiver is receiving signals.

12. The system of claim 11, wherein the programmable resistor network is configured to be programmed by turning on or turning off the first and second n-type transistors and the first and second p-type transistors.

* * * * *